United States Patent
Lee et al.

(10) Patent No.: US 12,081,230 B2
(45) Date of Patent: Sep. 3, 2024

(54) ANALOG-TO-DIGITAL CONVERTER AND OPERATING METHOD THEREOF

(71) Applicant: SAMSUNG ELECTRONICS CO., LTD., Suwon-si (KR)

(72) Inventors: Kyoungwon Lee, Uijeongbu-si (KR); Jintae Kim, Seoul (KR); Sungwon Roh, Yongin-si (KR)

(73) Assignees: SAMSUNG ELECTRONICS CO., LTD., Suwon-si (KR); Konkuk University Industrial Cooperation Corp, Seoul (KR)

( * ) Notice: Subject to any disclaimer, the term of this patent is extended or adjusted under 35 U.S.C. 154(b) by 125 days.

(21) Appl. No.: 17/871,538

(22) Filed: Jul. 22, 2022

(65) Prior Publication Data
US 2023/0021819 A1    Jan. 26, 2023

(30) Foreign Application Priority Data
Jul. 23, 2021  (KR) .................. 10-2021-0097210

(51) Int. Cl.
H03M 1/12    (2006.01)
H03M 1/36    (2006.01)

(52) U.S. Cl.
CPC ................... *H03M 1/365* (2013.01)

(58) Field of Classification Search
CPC ................................ H03M 1/365
USPC ................................ 341/155, 159
See application file for complete search history.

(56) References Cited

U.S. PATENT DOCUMENTS

| | | | |
|---|---|---|---|
| 5,202,687 A | 4/1993 | Distinti | |
| 5,644,308 A | 7/1997 | Kerth et al. | |
| 5,798,730 A * | 8/1998 | Sanchez | G01S 7/32 327/24 |
| 8,228,121 B2 | 7/2012 | Benhamouda et al. | |
| 8,330,631 B2 | 12/2012 | Kumar et al. | |
| 2004/0036453 A1 | 2/2004 | Rossi | |
| 2012/0133535 A1* | 5/2012 | Verbruggen | H03M 1/1023 341/110 |
| 2013/0328708 A1* | 12/2013 | Raphaeli | H03F 3/68 341/155 |
| 2017/0201217 A1* | 7/2017 | Waller, Jr. | H03F 3/185 |
| 2020/0373934 A1 | 11/2020 | Shibata et al. | |

* cited by examiner

*Primary Examiner* — Peguy Jean Pierre
(74) *Attorney, Agent, or Firm* — Sughrue Mion, PLLC (57) ABSTRACT

An analog-to-digital converter (ADC) for converting an analog signal into a digital signal includes an amplifier circuit configured to receive the analog signal, and to generate a plurality of amplifier signals by amplifying the analog signal; a comparison circuit configured to compare a plurality of voltage levels corresponding to the plurality of amplifier signals with a positive reference voltage level and a negative reference voltage level, and to output conversion target signals based on a result of the comparison; and a converter circuit configured to convert the conversion target signals into a plurality of digital signals.

19 Claims, 10 Drawing Sheets

ANALOG-TO-DIGITAL CONVERTER AND OPERATING METHOD THEREOF

CROSS-REFERENCE TO RELATED APPLICATION

This application is based on and claims priority under 35 U.S.C. § 119 to Korean Patent Application No. 10-2021-0097210, filed on Jul. 23, 2021, in the Korean Intellectual Property Office, the disclosure of which is incorporated by reference herein in its entirety.

BACKGROUND

1. Field

The disclosure relates to an analog-to-digital converter (ADC) and an operating method thereof, and more particularly, to converting a continuous time analog signal into a digital signal.

2. Description of Related Art

Recently, the use of high-performance digital system communication has increased, and accordingly, the demand for high-speed semiconductor circuit communication is rapidly increasing. Most video and audio-related communication systems use a receiver designed based on an analog-to-digital converter (ADC). Therefore, the importance of miniaturization and high speed of the ADC is increasing, and in particular, it is becoming important to reduce the delay error of a signal.

SUMMARY

Provided are an analog-to-digital converter (ADC) that does not require a correction circuit with respect to a delay error and an operating method thereof Additional aspects will be set forth in part in the description which follows and, in part, will be apparent from the description, or may be learned by practice of the presented embodiments.

In accordance with an aspect of the disclosure, an analog-to-digital converter (ADC) for converting an analog signal into a digital signal includes an amplifier circuit configured to receive the analog signal, and to generate a plurality of amplifier signals by amplifying the analog signal; a comparison circuit configured to compare a plurality of voltage levels corresponding to the plurality of amplifier signals with a positive reference voltage level and a negative reference voltage level, and to output conversion target signals based on a result of the comparison; and a converter circuit configured to convert the conversion target signals into a plurality of digital signals, wherein the amplifier circuit is further configured to generate a first amplifier signal from among the plurality of amplifier signals by adding the positive reference voltage level to a voltage level of the amplified analog signal, and generate a second amplifier signal from among the plurality of amplifier signals by subtracting the positive reference voltage level from the voltage level of the amplified analog signal.

In accordance with an aspect of the disclosure, an analog-to-digital converter (ADC) includes an amplifier circuit configured to receive an analog signal, and to generate a plurality of amplifier signals by and amplifying the analog signal; a plurality of converter circuits configured to convert the plurality of amplifier signals into a plurality of digital signals; and a selection circuit configured to: receive the plurality of digital signals, based on signals, from among the plurality of amplifier signals, having voltage levels lower than or equal to a positive reference voltage level and higher than or equal to a negative reference voltage level, select final digital signals corresponding to the signals, and output the final digital signals, wherein the amplifier circuit is further configured to: generate a first amplifier signal from among the plurality of amplifier signals by adding the positive reference voltage level to a voltage level of the amplified analog signal, and generate a second amplifier signal from among the plurality of amplifier signals by subtracting the positive reference voltage level from the voltage level of the amplified analog signal.

In accordance with an aspect of the disclosure, an operating method of an analog-to-digital converter (ADC) for converting an analog signal into a digital signal includes: generating a first amplifier signal from among a plurality of amplifier signals by adding a positive reference voltage level to a voltage level of an amplified analog signal; generating a second amplifier signal from among the plurality of amplifier signals by subtracting the positive reference voltage level from the voltage level of the amplified analog signal; and outputting the digital signal based on the first amplifier signal and the second amplifier signal.

In accordance with an aspect of the disclosure, an analog-to-digital converter (ADC) for converting an analog signal into a digital signal includes an amplifier circuit configured to: receive the analog signal and generate an amplified signal by amplifying the analog signal, generate a first amplifier signal by adding a positive reference voltage to the amplified analog signal, and generate a second amplifier signal by subtracting the positive reference voltage from the amplified analog signal; a converter circuit configured to generate the digital signal, wherein based on the first amplifier signal having a voltage level lower than or equal to the positive reference voltage and higher than or equal to a negative reference voltage corresponding to the positive reference voltage, the converter circuit is configured to generate the digital signal from the first amplifier signal, and wherein based on the second amplifier signal having the voltage level lower than or equal to the positive reference voltage and higher than or equal to the negative reference voltage, the converter circuit is configured to generate the digital signal from the first amplifier signal.

BRIEF DESCRIPTION OF THE DRAWINGS

The above and other aspects, features, and advantages of certain embodiments of the present disclosure will be more apparent from the following description taken in conjunction with the accompanying drawings in which.

DETAILED DESCRIPTION OF THE EMBODIMENTS

Hereinafter, embodiments are described in detail with reference to the accompanying drawings.

As is traditional in the field, embodiments may be described and illustrated in terms of blocks which carry out a described function or functions. These blocks, as shown in the drawings, which may be referred to herein as units or modules or the like, or by names such as device, circuit, receiver, interconnect, or the like, may be physically implemented by analog or digital circuits such as logic gates, integrated circuits, microprocessors, microcontrollers, memory circuits, passive electronic components, active electronic components, optical components, hardwired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

Figure 1:
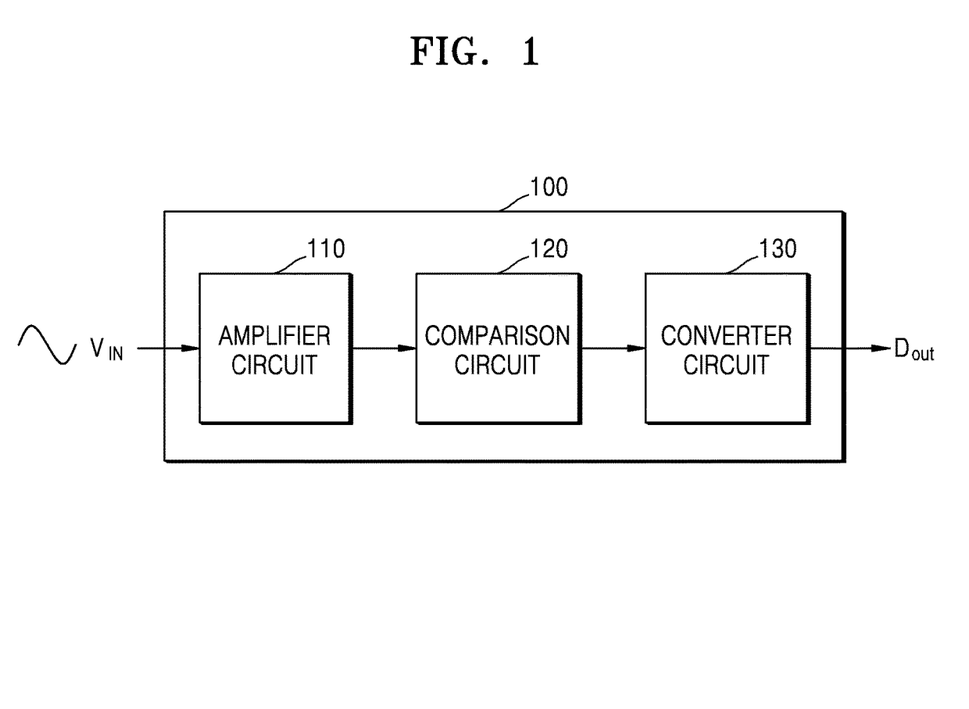
FIG. 1 is a block diagram illustrating an analog-to-digital converter (ADC) according to an example embodiment.

FIG. 1 is a block diagram illustrating an analog-to-digital converter (ADC) 100 according to an example embodiment.

Referring to FIG. 1, the ADC 100 according to an example embodiment may include an amplifier circuit 110, a comparison circuit 120 and a converter circuit 130, however embodiments are not limited thereto.

The amplifier circuit 110 may be a circuit configured to receive an analog signal and amplify the received analog signal into a plurality of amplifier signals. The received analog signal may be a continuous time analog signal.

The amplifier circuit 110 may be configured to output the plurality of amplifier signals to the comparison circuit 120.

The amplifier circuit 110 may include a plurality of amplifiers, at least one addition circuit, and/or at least one subtraction circuit. An example of a detailed description of the configuration of the amplifier circuit 110 is provided below.

The comparison circuit 120 may receive the plurality of amplifier signals from the amplifier circuit 110.

The comparison circuit 120 may be configured to compare voltage levels of the plurality of amplifier signals with a level of a positive reference voltage and a level of a negative reference voltage. The positive reference voltage may be a voltage corresponding to the largest value among voltage levels of the analog signal. Also, a value of the negative reference voltage may be a value obtained by multiplying a value of the positive reference voltage by a value of −1. In other words, the positive reference voltage and the negative reference voltage may have values having a same magnitude and different signs.

In embodiments, the comparison circuit 120 may be configured to output conversion target signals based on the corresponding comparison result. For example, the comparison circuit 120 may be configured to determine signals, among the plurality of amplifier signals, having voltage levels lower than or equal to the level of the positive reference voltage and higher than or equal to the level of the negative reference voltage as the conversion target signals, and output the determined conversion target signals.

The converter circuit 130 may be configured to receive the conversion target signals from the comparison circuit 120.

In embodiments, the converter circuit 130 may be configured to convert the conversion target signals into digital signals $D_{out}$ and output the digital signals $D_{out}$. For example, the converter circuit 130 may be a discrete time analog-to-digital converter circuit.

Figure 2:
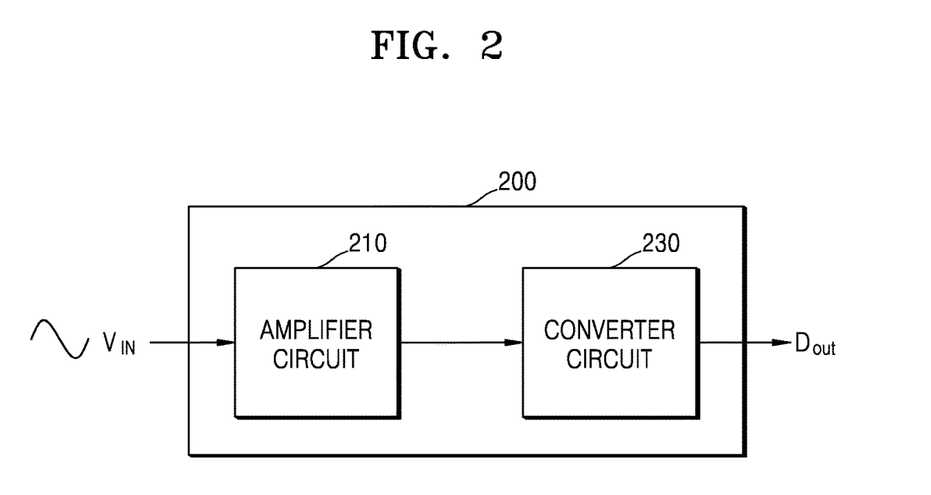
FIG. 2 is a block diagram illustrating an ADC according to an example embodiment.

FIG. 2 is a block diagram illustrating an ADC 200 according to an example embodiment.

Referring to FIG. 2, the ADC 200 according to an example embodiment may include an amplifier circuit 210 and/or a converter circuit 230.

The amplifier circuit 210 may be a circuit configured to receive an analog signal and amplify the received analog signal into a plurality of amplifier signals.

In embodiments, the amplifier circuit 210 may be configured to output the plurality of amplifier signals to the converter circuit 230.

In embodiments, the amplifier circuit 210 may include a plurality of amplifiers, at least one addition circuit, and/or at least one subtraction circuit. An example of a detailed description of the configuration of the amplifier circuit 210 is provided below.

The converter circuit 230 may be configured to receive the plurality of amplifier signals from the amplifier circuit 210.

In embodiments, the converter circuit 230 may be configured to convert the plurality of amplifier signals into digital signals $D_{out}$ and output the digital signals $D_{out}$.

In embodiments, the ADC 200 may include a plurality of converter circuits 230. The plurality of converter circuits 230 may be configured to receive the plurality of amplifier signals, respectively, and may be configured to convert the plurality of amplifier signals into a plurality of digital signals $D_{out}$.

In addition, each of the plurality of converter circuits 230 may be configured to output the digital signal $D_{out}$ indicating overflow when a voltage level of an amplifier signal, among the plurality of amplifier signals, exceeds a level of a positive reference voltage or is lower than a level of a negative reference voltage. For example, when the amplifier signal, among the plurality of received amplifier signals, has a voltage level that exceeds the level of the positive reference voltage or is lower than the level of the negative reference voltage, each of the plurality of converter circuits 230 may be configured to output a digital signal $D_{out}$ having only a value of 1 (e.g., 11111) or a digital signal $D_0$ having only a value of 0 (e.g., 00000) as an overflow signal.

In embodiments, the ADC 200 may include a selection circuit.

The selection circuit may be configured to receive the digital signals $D_{out}$ from the converter circuits 230 and select and output final digital signals corresponding to signals, among the plurality of amplifier signals, having voltage levels lower than or equal to the level of the positive reference voltage and higher than or equal to the level of the negative reference voltage. In this regard, a final digital signal may be an output signal of the ADC 200. For example, the selection circuit may be configured not to select the digital signal $D_{out}$ indicating overflow as the final digital signal. In other words, the digital signal $D_{out}$ indicating overflow may be an unnecessary signal in converting the analog signal into the digital signal $D_{out}$. Accordingly, the selection circuit may be configured to determine digital signals $D_{out}$ other than the digital signal $D_{out}$ indicating overflow as the final digital signals and output the final digital signals.

The ADCs 100 and 200 according to an example embodiment respectively include the amplifier circuits 110 and 210 described above, and thus, even when a continuous time analog signal is input, the input analog signal may be continuously compared with a specific range, for example a specific range that is lower than or equal to the level of the positive reference voltage and higher than or equal to the level of the negative reference voltage, which may not cause a delay error to occur. Accordingly, the ADCs 100 and 200 may not generate errors due to delay errors, may not require a separate circuit for correcting delay errors, may have a simple structure, and may be configured to consume less power. Also, the ADCs 100 and 200 may not be sensitive to process errors.

Figure 3:
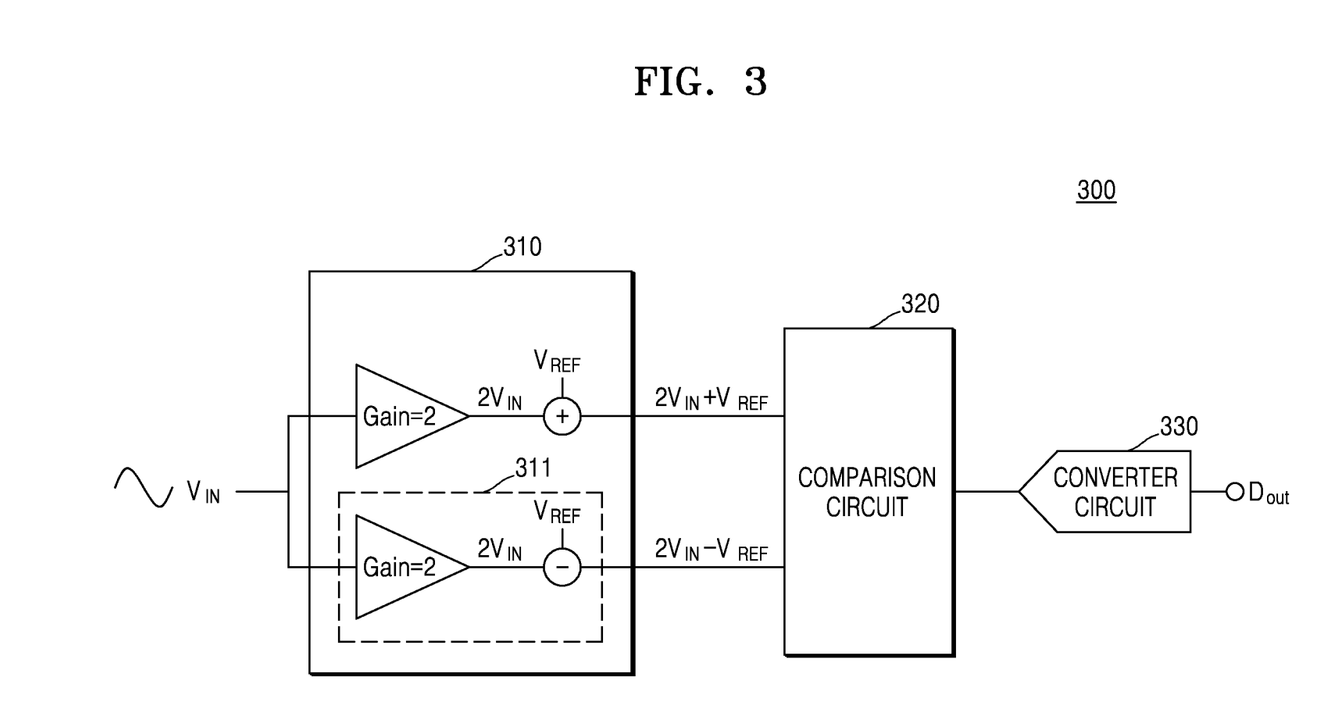
FIG. 3 is a diagram illustrating an ADC according to an example embodiment.

FIG. 3 is a diagram illustrating an ADC 300 according to an example embodiment.

Referring to FIG. 3, the ADC 300 according to an example embodiment may include an amplifier circuit 310, a comparison circuit 320 and/or a converter circuit 330.

The amplifier circuit 310 may correspond to the amplifier circuits 110 and 210 described above with reference to FIGS. 1 and 2 and may be configured to perform the same function.

The amplifier circuit 310 may be configured to generate a first amplifier signal among a plurality of amplifier signals by adding a level of a positive reference voltage $V_{REF}$ to a voltage level of an amplified analog signal, and generate a second amplifier signal among the plurality of amplifier signals by subtracting the level of the positive reference voltage $V_{REF}$ from the voltage level of the amplified analog signal.

The amplifier circuit 310 may include a plurality of amplifiers amplifying an analog signal, an addition circuit, and a subtraction circuit. Specifically, the amplifier circuit 310 may include the addition circuit configured to generate the amplifier signal by adding the level of the positive reference voltage $V_{REF}$ to a voltage level of an output signal of the amplifier and the subtraction circuit configured to generate the amplifier signal by subtracting the level of the positive reference voltage $V_{REF}$ from the voltage level of the output signal of the amplifier.

In embodiments, a voltage gain of the plurality of amplifiers may be 2. For example, when the voltage gain of the plurality of amplifiers is 2, a voltage level of the above-described first amplifier signal may have a value of $2V_{IN}+V_{REF}$, and a voltage level of the second amplifier signal may have a value of $2V_{IN}-V_{REF}$.

The comparison circuit 320 may correspond to the comparison circuit 120 described above with reference to FIG. 1, and may be configured to perform the same function.

The first amplifier signal and the second amplifier signal may be input to the comparison circuit 320.

Figure 4:
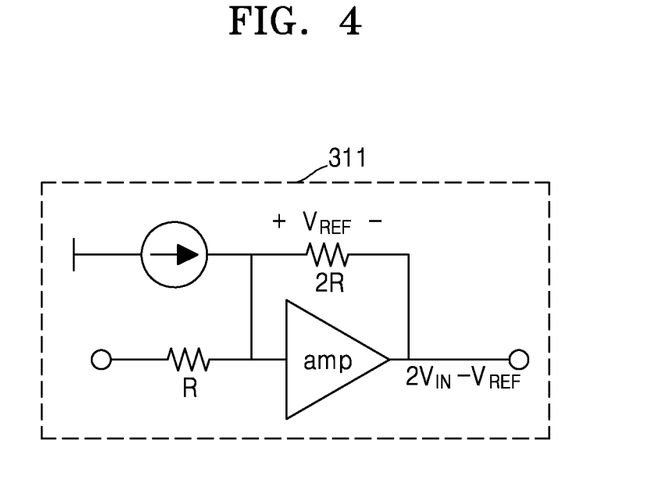
FIG. 4 is a diagram illustrating an amplifier circuit according to an example embodiment.

FIG. 4 is a diagram illustrating the amplifier circuit 310 according to an example embodiment.

Referring to FIGS. 3 and 4, the amplifiers and the subtraction circuit included in the amplifier circuit 310 may be configured as a circuit 311 shown in FIG. 4, and accordingly, the circuit 311 may be configured to have a voltage gain of 2 and output a signal of $2V_{IN}-V_{REF}$ by subtracting a level of the reference voltage $V_{REF}$ from a voltage level of an amplified analog signal $2V_{IN}$. However, the configuration of the circuit 311 included in the amplifier circuit 310 is not limited to that illustrated in FIG. 4.

Resistors may be included in input terminals of the amplifiers included in the amplifier circuit 310. In other words, a resistor may be connected to each of the input terminals of the amplifiers included in the amplifier circuit 310. Accordingly, a separate switch sampling an input signal may not be required, and the ADC 300 may be implemented to have a small size, which may be advantageous for miniaturization. Also, the ADC 300 may convert a signal having a wide bandwidth. Accordingly, the ADC 300 may be used in an ultra-wideband wireless communication system or a receiving terminal of a memory interface greater than or equal to 100 Gbps.

Figure 5:
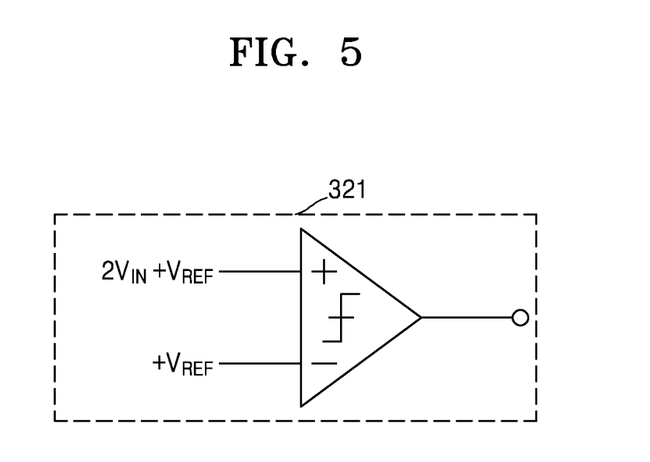
FIG. 5 is a diagram illustrating a comparison circuit according to an example embodiment.

FIG. 5 is a diagram illustrating the comparison circuit 320 according to an example embodiment.

Referring to FIGS. 3 and 5, the comparison circuit 320 may include a comparator 321. Also, the comparison circuit 320 may include a plurality of comparators. In addition, it is shown in FIG. 3 that the voltage $2V_{IN}+V_{REF}$ of the amplifier signals and the reference voltage $V_{REF}$ are applied to the comparator 321, but the example embodiment is not limited thereto. Amplifier signals having voltages different from the above-described voltage and a reference voltage signal may be input to the comparator 321.

Figure 6:
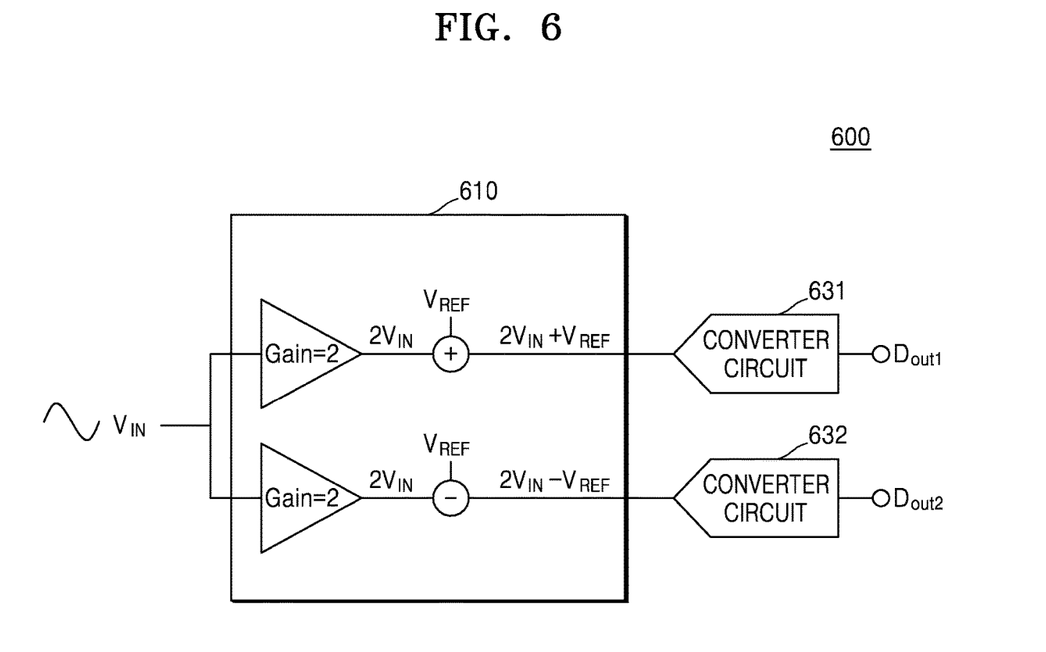
FIG. 6 is a diagram illustrating an ADC according to an example embodiment.

FIG. 6 is a diagram illustrating an ADC 600 according to an example embodiment.

Referring to FIG. 6, the ADC 600 according to an example embodiment may include an amplifier circuit 610 and/or a plurality of converter circuits, for example converter circuit 631 and converter circuit 632.

The amplifier circuit 610 may correspond to each of the amplifier circuits 110, 210, and 310 described above with reference to FIGS. 1, 2, and 3, and may be configured to perform the same function. For example, the amplifier circuit 610 may include two amplifiers having a voltage gain of 2, and each of the two amplifiers may be connected to one of an addition circuit and a subtraction circuit. Accordingly, the amplifier circuit 610 may be configured to output an amplifier signal having a voltage of $2V_{IN}+V_{REF}$ and an amplifier signal having a voltage of $2V_{IN}-V_{REF}$ to the converter circuit 631 and the converter circuit 632, respectively. The plurality of converter circuits 631 and 632 may be respectively connected to output terminals of the amplifier circuit 610. The number of amplifiers included in the amplifier circuit 610 is not limited to 2, and the numbers of addition circuits, subtraction circuits, and converter circuits are not limited as described above.

In addition, as described above with respect to FIG. 2, when an amplifier signal, among a plurality of amplifier signals, is received which has a voltage level that exceeds a level of the positive reference voltage $V_{REF}$ and is lower than a level of the negative reference voltage $-V_{REF}$, each of the plurality of converter circuits 631 and 632 may be configured to output a digital signal indicating overflow.

Figure 7:
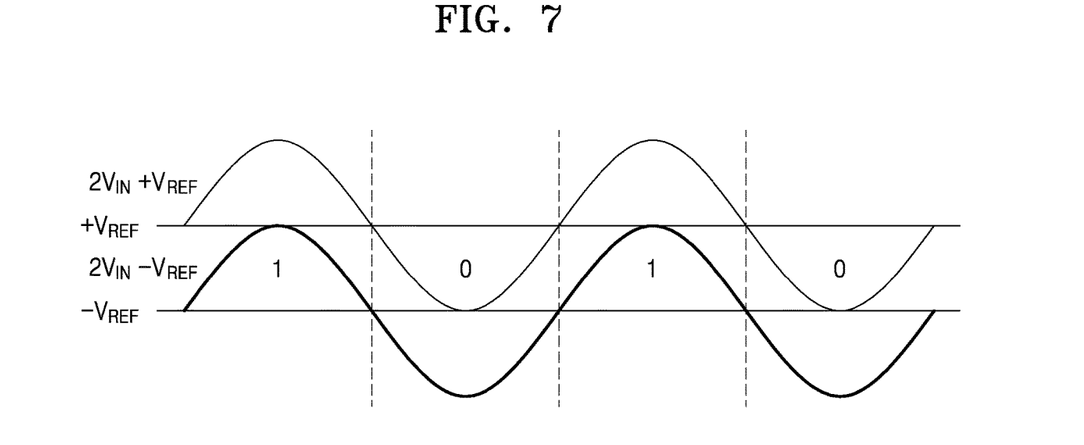
FIG. 7 is a graph illustrating an operation of a comparison circuit according to an example embodiment.

FIG. 7 is a graph illustrating an operation of the comparison circuit 320 according to an example embodiment.

Referring to FIGS. 3 and 7, the comparison circuit 320 according to an example embodiment may be configured to determine signals, among a plurality of amplifier signals, having voltage levels lower than or equal to a level of the positive reference voltage $V_{REF}$ and higher than or equal to a level of the negative reference voltage $-V_{REF}$ as conversion target signals.

For example, the comparison circuit 320 may be configured to determine the conversion target signals such that the conversion target signals include a signal when a voltage level of an amplifier signal having a voltage of $2V_{IN}-V_{REF}$ is equal to or higher than the level of the negative reference voltage $-V_{REF}$.

In embodiments, the comparison circuit 320 may be configured to determine the conversion target signals such that the conversion target signals include a signal when a voltage level of an amplifier signal having a voltage of $2V_{IN}+V_{REF}$ is equal to or lower than the level of the positive reference voltage $V_{REF}$.

In embodiments, the comparison circuit 320 may be configured to output a digital bit having a value of 1 when a level of a voltage $V_{IN}$ of an analog signal is greater than 0. For example, in the graph of FIG. 7, when the level of the voltage $2V_{IN}+V_{REF}$ of the amplifier signal to which the level of the positive reference voltage $V_{REF}$ is added is higher than the level of the positive reference voltage $V_{REF}$, or when the level of the voltage $2V_{IN}-V_{REF}$ of the amplifier signal from which the level of the positive reference voltage $V_{REF}$ is subtracted is higher than the level of the positive reference voltage $V_{REF}$, the level of the voltage $V_{IN}$ of the analog signal is greater than 0, and thus, at this time, the comparison circuit 320 may be configured to output a digital bit having a value of 1.

In embodiments, the comparison circuit 320 may be configured to output a digital bit having a value of 0 when the level of the voltage $V_{IN}$ of the analog signal is less than 0. For example, when the level of the voltage $2V_{IN}+V_{REF}$ of the amplifier signal to which the level of the positive reference voltage $V_{REF}$ is added is lower than the level of the positive reference voltage $V_{REF}$, or when the level of the voltage $2V_{IN}-V_{REF}$ of the amplifier signal from which the level of the positive reference voltage $V_{REF}$ is subtracted is lower than the level of the positive reference voltage $V_{REF}$, the level of the voltage $V_{IN}$ of the analog signal is less than 0, and thus, at this time, the comparison circuit 320 may be configured to output a digital bit having a value of 0.

The converter circuit 330 may be configured to determine a digital bit received from the comparison circuit 320 as the most significant bit of bits of digital signals.

Figure 8:
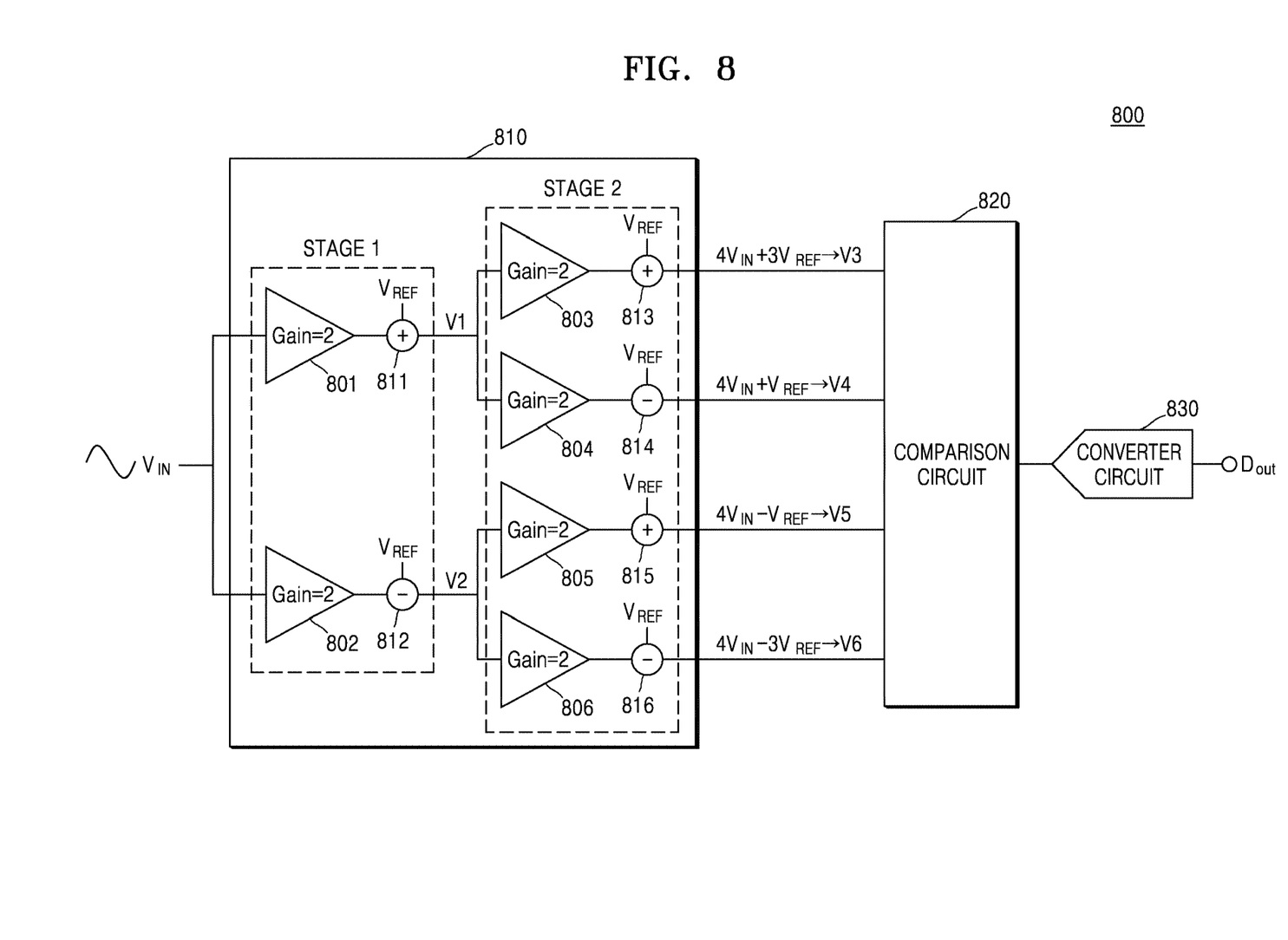
FIG. 8 is a diagram illustrating an ADC according to an example embodiment.

FIG. 8 is a diagram illustrating an ADC 800 according to an example embodiment.

Referring to FIG. 8, the ADC 800 according to an example embodiment may include an amplifier circuit 810 including a plurality of stages, a comparison circuit 820, and a converter circuit 830. As described above with reference to FIG. 2, even in the ADC 200 in which the amplifier circuit 210 is connected to the converter circuit 230, the amplifier circuit 210 may include a plurality of stages.

The amplifier circuit 810 may include a first amplifier 801, a second amplifier 802, a third amplifier 803, a fourth amplifier 804, a fifth amplifier 805, and a sixth amplifier 806 amplifying analog signals.

In addition, the amplifier circuit 810 may include a first addition circuit 811, a second addition circuit 813, a third addition circuit 815, a first subtraction circuit 812, a second subtraction circuit 814, and a third subtraction circuit 816.

The first amplifier 801 and the second amplifier 802 may be connected in parallel. Also, the first amplifier 801 may be connected to the first addition circuit 811, and the second amplifier 802 may be connected to the first subtraction circuit 812.

A first stage Stage1 may include the first amplifier 801 and the second amplifier 802 connected in parallel, the first addition circuit 811 connected to the first amplifier 801, and the first subtraction circuit 812 connected to the second amplifier 802.

The first addition circuit 811 may be configured to generate a first amplifier signal V1 by adding a level of the positive reference voltage $V_{REF}$ to a voltage level of an output signal of the first amplifier 801. When a voltage gain of the first amplifier 801 is 2, a voltage of the first amplifier signal V1 may be $2V_{IN}+V_{REF}$.

The first subtraction circuit 812 may be configured to generate a second amplifier signal V2 by subtracting the level of the positive reference voltage $V_{REF}$ from a voltage level of an output signal of the second amplifier 802. When a voltage gain of the second amplifier 802 is 2, a voltage of the second amplifier signal V2 may be $2V_{IN}-V_{REF}$.

The third amplifier 803 and the fourth amplifier 804 may be connected in parallel. Also, the third amplifier 803 and the fourth amplifier 804 may be configured to receive the first amplifier signal V1. Also, the third amplifier 803 may be connected to the second addition circuit 813, and the fourth amplifier 804 may be connected to the second subtraction circuit 814.

The fifth amplifier 805 and the sixth amplifier 806 may be connected in parallel. Also, the fifth amplifier 805 and the sixth amplifier 806 may be configured to receive the second amplifier signal V2. Also, the fifth amplifier 805 may be connected to the third addition circuit 815, and the sixth amplifier 806 may be connected to the third subtraction circuit 816.

A second stage Stage2 may include the third amplifier 803 and the fourth amplifier 804 connected in parallel, the fifth amplifier 805 and the sixth amplifier 806 connected in parallel, the second addition circuit 813 connected to the third amplifier 803, the second subtraction circuit 814 connected to the fourth amplifier 804, the third addition circuit 815 connected to the fifth amplifier 805, and the third subtraction circuit 816 connected to the sixth amplifier 806.

The second addition circuit 813 may be configured to generate a third amplifier signal V3 by adding the level of the positive reference voltage $V_{REF}$ to a voltage level of an output signal of the third amplifier 803. When a voltage gain of the third amplifier 803 is 2, a voltage of the third amplifier signal V3 may be $4V_{IN}+3V_{REF}$.

The second subtraction circuit 814 may be configured to generate a fourth amplifier signal V4 by subtracting the level of the positive reference voltage $V_{REF}$ from a voltage level of an output signal of the fourth amplifier 804. When a voltage gain of the fourth amplifier 804 is 2, a voltage of the fourth amplifier signal V4 may be $4V_{IN}+V_{REF}$.

The third addition circuit 815 may be configured to generate a fifth amplifier signal V5 by adding the level of the positive reference voltage $V_{REF}$ to a voltage level of an output signal of the fifth amplifier 805. When a voltage gain of the fifth amplifier 805 is 2, a voltage of the fifth amplifier signal V5 may be $4V_{IN}-V_{REF}$.

The third subtraction circuit 816 may be configured to generate a sixth amplifier signal V6 by subtracting the level of the positive reference voltage $V_{REF}$ from a voltage level of an output signal of the sixth amplifier 806. When a voltage gain of the sixth amplifier 806 is 2, a voltage of the sixth amplifier signal V6 may be $4V_{IN}-3V_{REF}$.

The third through sixth amplifier signals V3 through V6 may be input to the comparison circuit 820. In addition, the comparison circuit 820 may be configured to compare each of the voltage levels of the third through sixth amplifier signals V3 through V6 with the level of the positive reference voltage $V_{REF}$ or a level of the negative reference voltage $-V_{REF}$. Also, the comparison circuit 820 may be configured to determine a conversion target signal based on a comparison result.

In embodiments, the third through sixth amplifier signals V3 through V6 may be respectively input to a plurality of converter circuits, and the plurality of converter circuits may be configured to perform the above-described operations.

In addition, although not shown in FIG. 8, the ADC 800 is not limited to including one or two stages, and may include N stages. Specifically, the ADC 800 may include a first stage Stage1 to an Nth stage StageN that are sequentially connected.

When the ADC 800 includes N stages, an input signal may be quantized into $2^N$ types of digital bits. For example, when the ADC 800 includes two stages, the input signal may be quantized into a 2-bit digital signal having four digital levels, for example [00, 01, 10, 11].

The Nth stage StageN may include $2^N$ amplifiers connected in parallel by two, $2^{N-1}$ addition circuits respectively connected to some amplifiers, and $2^{N-1}$ subtraction circuits respectively connected to other amplifiers. In addition, the amplifiers included in the Nth stage StageN may be configured to respectively receive output signals (amplifier signals) of an N−1th stage StageN−1.

Figure 9:
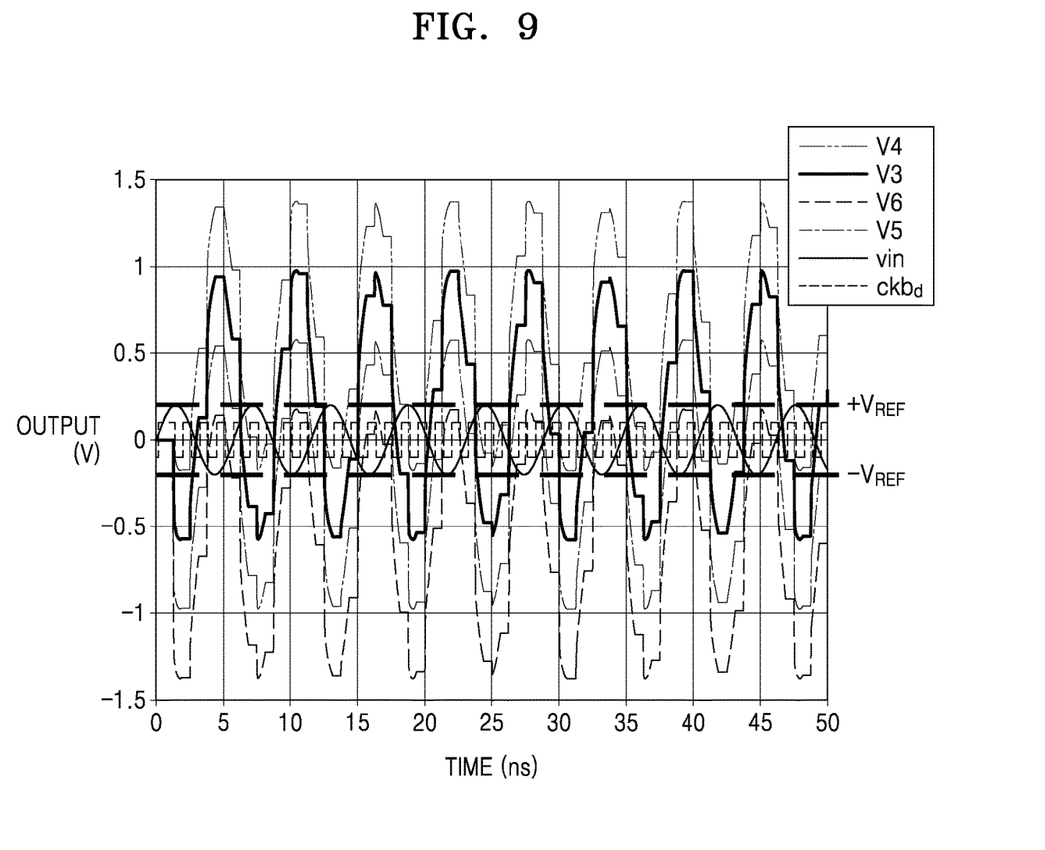
FIG. 9 is a graph illustrating an operation of a comparison circuit according to an example embodiment.

FIG. 9 is a graph illustrating an operation of the comparison circuit 820 according to an example embodiment.

Referring to FIGS. 8 and 9, among a plurality of amplifier signals of the comparison circuit 820 according to an example embodiment, the third amplifier signal V3, the fourth amplifier signal V4, the fifth amplifier signal V5, and the sixth amplifier signal V6 may be represented as in the graph of FIG. 9. A signal ckba shown in the graph of FIG. 9 may represent a clock signal, and a signal Vin may be an analog signal input to an amplifier circuit.

The comparison circuit 820 may be configured to determine signals, among the third through sixth amplifier signals V3 through V6, having voltage levels lower than or equal to a level of the positive reference voltage $V_{REF}$ and higher than or equal to a level of the negative reference voltage $-V_{REF}$ as conversion target signals.

The signals, among the third through sixth amplifier V3 through V6, having voltage levels lower than or equal to the level of the positive reference voltage $V_{REF}$ and higher than or equal to the level of the negative reference voltage $-V_{REF}$ may be sampled with respect to when the clock signal $ckb_d$ is a rising edge, but are not limited thereto.

Figure 10A:
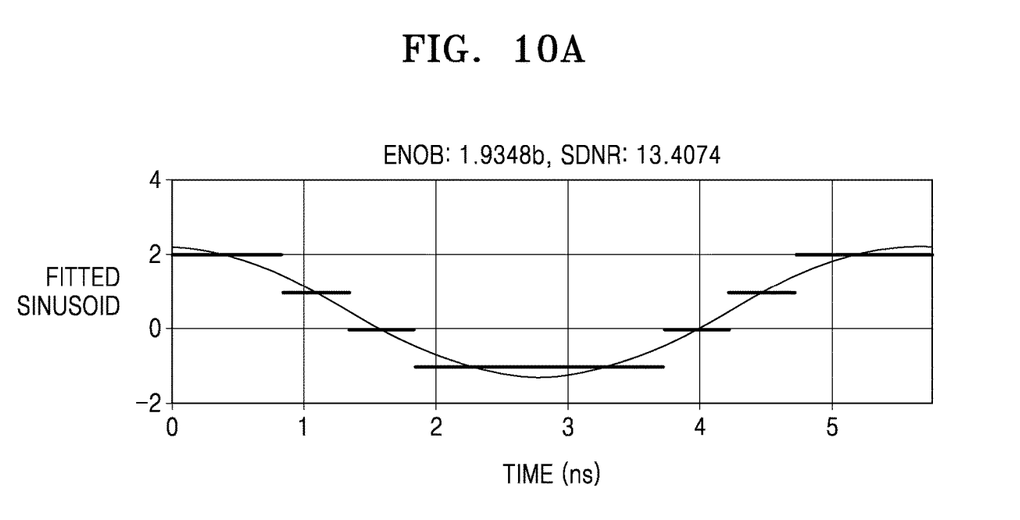
FIGS. 10A and 10B are graphs illustrating an output signal of an ADC according to an example embodiment.
Figure 10B:
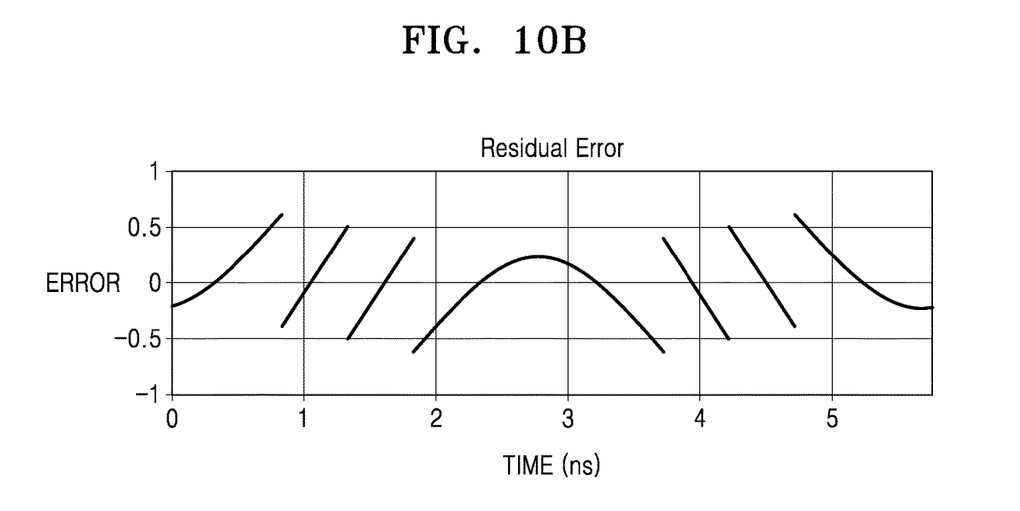

FIGS. 10A and 10B are graphs illustrating an output signal of an ADC according to an example embodiment.

Referring to FIG. 10A, the ADC according to an example embodiment may be configured to receive an analog signal and output a quantized digital signal. A straight line quantized on the graph of FIG. 10A is an example of the output signal of the ADC. Also, a curve shown as a sine wave on the graph of FIG. 10A may represent the input analog signal.

As an example, the effective number of bits (ENOB) may be about 2 bits, and the signal-to-noise distortion ratio (SNDR) may have a value of about 13.4074, but the example embodiment is not limited thereto.

FIG. 10B is a graph illustrating an example of an error between the quantized output signal and the input analog signal of the ADC shown in FIG. 10A.

Figure 11:
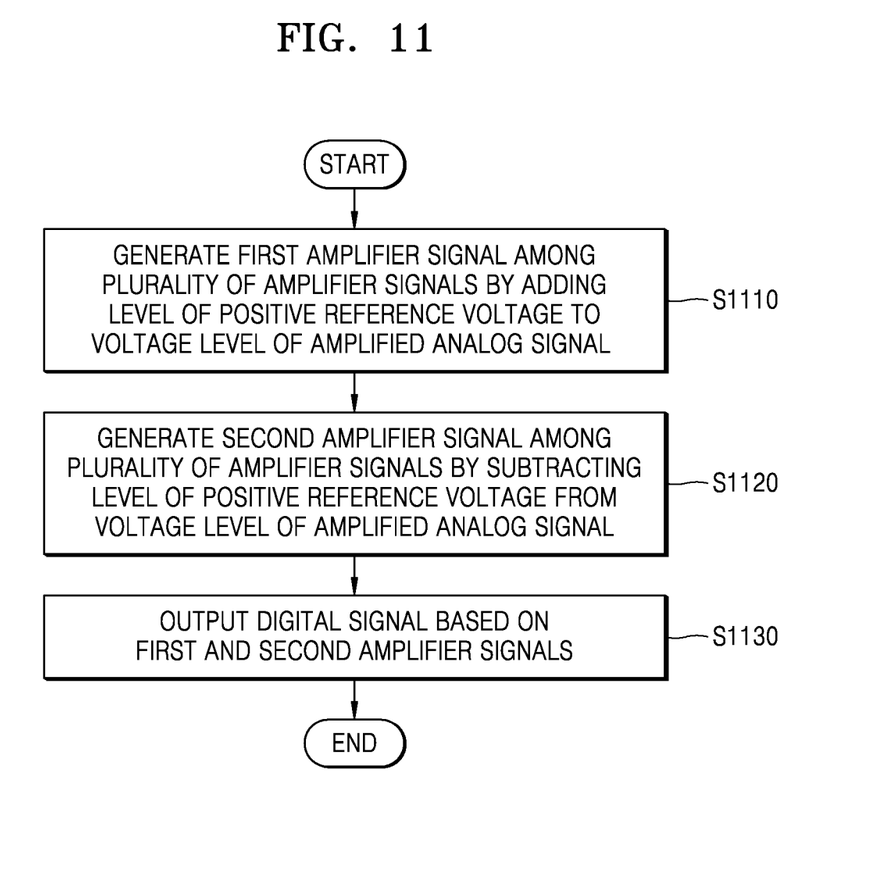
FIG. 11 is a flowchart illustrating an operating method of an ADC according to an example embodiment.

FIG. 11 is a flowchart illustrating an operating method of an ADC according to an example embodiment.

Referring to FIG. 11, in operation S1110, the operating method of the ADC according to an example embodiment may generate a first amplifier signal among a plurality of amplifier signals, by adding a level of a positive reference voltage to a voltage level of an amplified analog signal. For example, the first amplifier signal may be generated by amplifying the analog signal two times by an amplifier having a voltage gain of 2, and adding the level of the positive reference voltage to the voltage level of the amplified analog signal.

In operation S1120, the operating method of the ADC according to an example embodiment may generate a second amplifier signal among the plurality of amplifier signals, by subtracting the level of the positive reference voltage from the voltage level of the amplified analog signal. For example, the second amplifier signal may be generated by amplifying the analog signal two times by the amplifier having a voltage gain of 2, and subtracting the level of the positive reference voltage from the voltage level of the amplified analog signal.

In operation S1130, the operating method of the ADC according to an example embodiment may output a digital signal based on the first amplifier signal and the second amplifier signal. For example, the digital signal may be determined as discussed with respect to any of the embodiments described above with respect to FIGS. 1-11.

In embodiments, the operating method of the ADC may include converting signals, among the plurality of amplifier signals, having voltage levels lower than or equal to the level of the positive reference voltage and higher than or equal to a level of a negative reference voltage into digital signals.

In embodiments, when a voltage level of an amplifier signal among the plurality of amplifier signals exceeds the level of the positive reference voltage and is lower than the level of the negative reference voltage, the operating method of the ADC may include generating an overflow digital signal indicating overflow and not outputting the overflow digital signal.

Figure 12:
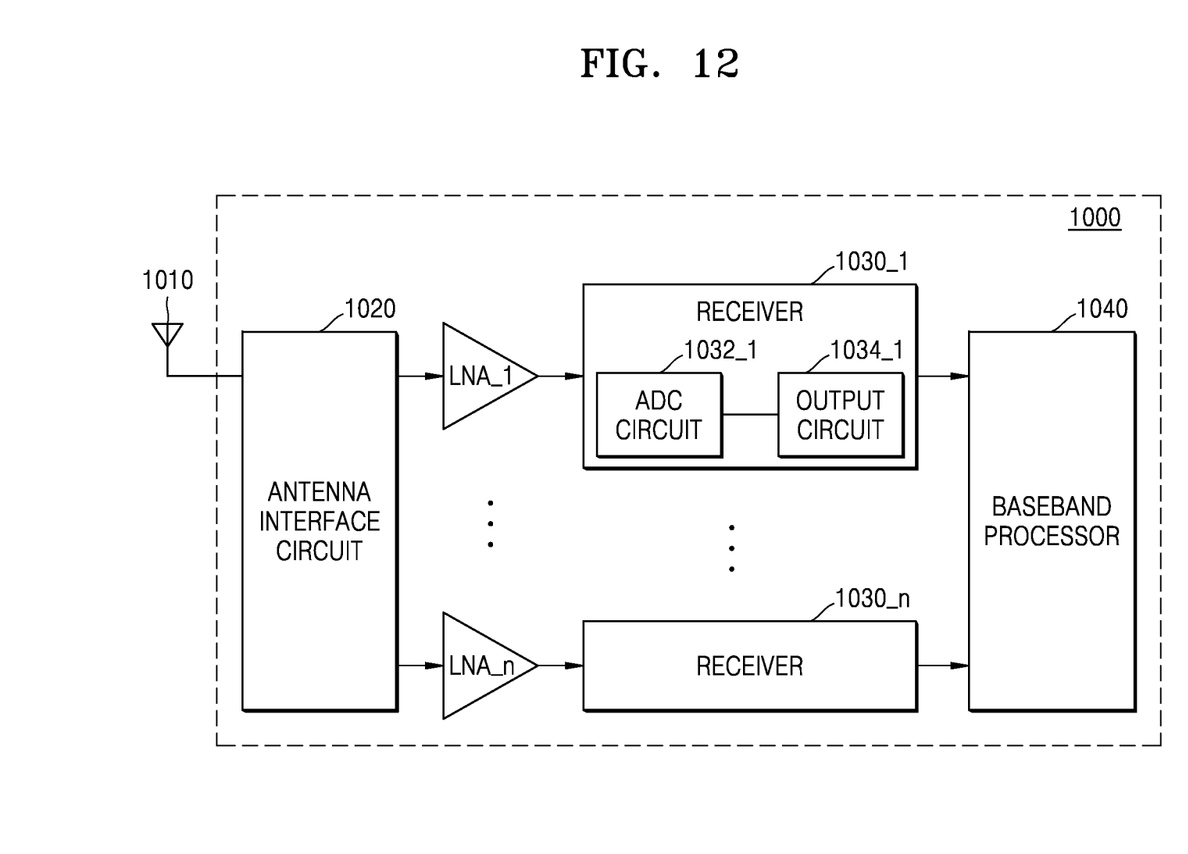
FIG. 12 is a block diagram illustrating a wireless communication device according to an example embodiment.

FIG. 12 is a block diagram illustrating a wireless communication device 1000 according to an example embodiment.

Referring to FIG. 12, the wireless communication device 1000 may include an antenna 1010, an antenna interface circuit 1020, a plurality of low noise amplifiers, for example first low noise amplifier LNA_1 through $n^{th}$ low noise amplifier LNA_n, a plurality of receivers, for example first receiver 1030_1 through $n^{th}$ receiver 1030_n, and a baseband processor 1040.

The antenna interface circuit 1020 may route an analog signal received through the antenna 1010 to any one of the plurality of receivers 1030_1 through 1030_n. The antenna interface circuit 1020 may include switch elements, a duplexer, a filter circuit, an input matching circuit, etc.

The plurality of low-noise amplifiers LNA_1 through LNA_n may perform low-noise amplification on the received analog signal and output the analog signal to the plurality of receivers 1030_1 to 1030_n, respectively, connected thereto.

The baseband processor 1040 may perform a processing operation including a demodulation operation on digital signals transmitted from the plurality of receivers 1030_1 through 1030_n.

In an example embodiment, the first receiver 1030_1 may include an ADC circuit 1032_1 and an output circuit 1034_1 to which the example embodiments are applied. The ADC circuit 1032_1 may convert an analog signal received from the first low noise amplifier LNA_1 into a digital signal, and may perform time skew correction to which the example embodiment is applied during a conversion operation. In addition, a time skew error has already been corrected during an ADC operation by performing time skew correction as a background operation, and thus the ADC circuit 1032_1 may quickly provide a digital signal having improved quality to the baseband processor 1040. In some example embodiments, the first receiver 1030_1 may be implemented to further include the first low-noise amplifier LNA_1.

In an example embodiment, the output circuit 1034_1 may perform an operation of improving the quality of the digital signal output from the ADC circuit 1032_1. For example, the output circuit 1034_1 may equalize the digital signal based on at least one of continuous time linear equalization (CTLE), decision feedback equalization (DFE), or feedforward equalization (FFE).

The above-described configuration of the first receiver 1030_1 may also be applied to the other receivers, for example second receiver 1030_2 through $n^{th}$ receiver 1030_n.

Figure 13:
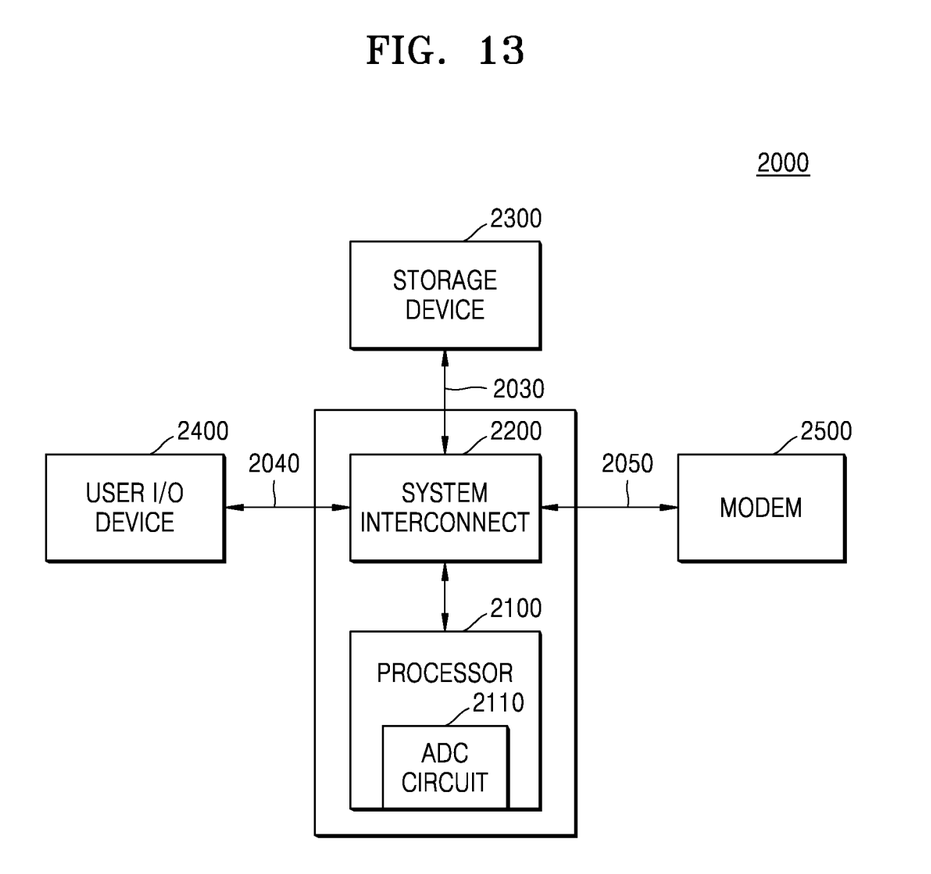
FIG. 13 is a block diagram illustrating a computing system according to an example embodiment.

FIG. 13 is a block diagram illustrating a computing system 2000 according to an example embodiment.

Referring to FIG. 13, the computing system 2000 may include a processor 2100, a system interconnect 2200, a storage device 2300, a user input/output (I/O) device 2400, and a modem 2500. In some example embodiments, the processor 2100, the system interconnect 2200, the storage device 2300, the user I/O device 2400, and the modem 2500 may be mounted on one substrate. The storage device 2300, the user I/O device 2400, and the modem 2500 may be connected to the system interconnect 2200 through channels 2030, 2040, and 2050, respectively. Each of the channels 2030, 2040, and 2050 may be based on one of various standards such as peripheral component interconnect express (PCIe), nonvolatile memory express (NVMe), advanced eXtensible interface (AXI), ARM microcontroller bus architecture (AMBA), etc.

The storage device 2300 may function as a memory of the computing system 2000. The storage device 2300 may store the operating system, application, and original user data driven by the processor 2100. The storage device 2300 may include a hard disk drive (HDD), a solid state drive (SSD), an optical disk drive (ODD), etc.

The user I/O device 2400 may be configured to exchange information with a user. The user I/O device 2400 may include a user input device that receives information from the user, such as a keyboard, a mouse, a touch panel, a motion sensor, a microphone, etc. The user I/O device 2400 may include a user output device that provides information to the user, such as a display device, a speaker, a beam projector, a printer, etc.

The modem 2500 may be configured to exchange data with an external device wirelessly or by wire. In an example embodiment, the modem 2500 may be integrated with the processor 2100.

The processor 2100 may include a central processing unit or an application processor that controls the computing system 2000 and performs various operations. The processor 2100 may include an ADC circuit 2110 to which the example embodiment is applied. The ADC circuit 2110 may convert an analog signal received from the storage device 2300, the user I/O device 2400, and the modem 2500 through the system interconnect 2200 into a digital signal, and perform time skew correction to which the example embodiment is applied during a conversion operation. In addition, a time skew error has already been corrected during an ADC operation by performing time skew correction as a background operation, and thus, the ADC circuit 2110 may quickly provide a digital signal having improved quality to the processor 2100. In some example embodiments, the ADC circuit 2110 may be implemented to be included in the system interconnect 2200.

While the inventive concept has been particularly shown and described with reference to embodiments thereof, it will be understood that various changes in form and details may be made therein without departing from the spirit and scope of the following claims.

What is claimed is:

1. An analog-to-digital converter (ADC) for converting an analog signal into a digital signal, the ADC comprising:
    an amplifier circuit configured to receive the analog signal, and to generate a plurality of amplifier signals by amplifying the analog signal;
    a comparison circuit configured to compare a plurality of voltage levels corresponding to the plurality of amplifier signals with a positive reference voltage level and a negative reference voltage level, and to output conversion target signals based on a result of the comparison; and
    a converter circuit configured to convert the conversion target signals into a plurality of digital signals,
    wherein the amplifier circuit is further configured to:
        generate a first amplifier signal from among the plurality of amplifier signals by adding the positive reference voltage level to a voltage level of the amplified analog signal, and
        generate a second amplifier signal from among the plurality of amplifier signals by subtracting the positive reference voltage level from the voltage level of the amplified analog signal.

2. The ADC of claim 1, wherein the amplifier circuit comprises a first amplifier and a second amplifier configured to amplify the analog signal;
    a first addition circuit configured to generate the first amplifier signal by adding the positive reference voltage level to a voltage level of an output signal of the first amplifier; and
    a first subtraction circuit configured to generate the second amplifier signal by subtracting the positive reference voltage level from a voltage level of an output signal of the second amplifier.

3. The ADC of claim 2, wherein the first amplifier and the second amplifier have a voltage gain of 2.

4. The ADC of claim 2, wherein the first amplifier is connected in parallel with the second amplifier.

5. The ADC of claim 4, wherein the amplifier circuit further comprises:
    a third amplifier and a fourth amplifier configured to receive the first amplifier signal;
    a fifth amplifier and a sixth amplifier configured to receive the second amplifier signal;
    a second addition circuit configured to generate a third amplifier signal from among the plurality of amplifier signals by adding the positive reference voltage level to a voltage level of an output signal of the third amplifier;
    a second subtraction circuit configured to generate a fourth amplifier signal from among the plurality of amplifier signals by subtracting the positive reference voltage level from a voltage level of an output signal of the fourth amplifier;
a third addition circuit configured to generate a fifth amplifier signal from among the plurality of amplifier signals by adding the positive reference voltage level to a voltage level of an output signal of the fifth amplifier; and
a third subtraction circuit configured to generate a sixth amplifier signal from among the plurality of amplifier signals by subtracting the positive reference voltage level from a voltage level of an output signal of the sixth amplifier.

6. The ADC of claim 1, wherein the comparison circuit is configured to select signals, from among the plurality of amplifier signals, as the conversion target signals, based on the signals having a voltage level lower than or equal to the positive reference voltage level and higher than or equal to the negative reference voltage level.

7. The ADC of claim 6, wherein the comparison circuit is configured to output a digital bit with a value of 1 based on a voltage level of the analog signal being greater than 0, and to output the digital bit with a value of 0 based on the voltage level of the analog signal being less than 0, and
wherein the converter circuit is configured to determine the digital bit as a most significant bit of bits of digital signals.

8. An analog-to-digital converter (ADC) comprising:
an amplifier circuit configured to receive an analog signal, and to generate a plurality of amplifier signals by and amplifying the analog signal;
a plurality of converter circuits configured to convert the plurality of amplifier signals into a plurality of digital signals; and
a selection circuit configured to:
receive the plurality of digital signals,
based on signals, from among the plurality of amplifier signals, having voltage levels lower than or equal to a positive reference voltage level and higher than or equal to a negative reference voltage level, select final digital signals corresponding to the signals, and output the final digital signals,
wherein the amplifier circuit is further configured to:
generate a first amplifier signal from among the plurality of amplifier signals by adding the positive reference voltage level to a voltage level of the amplified analog signal, and
generate a second amplifier signal from among the plurality of amplifier signals by subtracting the positive reference voltage level from the voltage level of the amplified analog signal.

9. The ADC of claim 8, wherein each of the plurality of converter circuits is configured to output a digital signal indicating an overflow based on receiving an amplifier signal, from among the plurality of amplifier signals, having a voltage level that is higher than the positive reference voltage level and lower than the negative reference voltage level.

10. The ADC of claim 9, wherein the selection circuit is further configured to not select the digital signal indicating the overflow as a final digital signal.

11. The ADC of claim 8, wherein the amplifier circuit comprises:
a first amplifier and a second amplifier configured to amplify the analog signal;
a first addition circuit configured to generate the first amplifier signal by adding the positive reference voltage level to a voltage level of an output signal of the first amplifier; and
a first subtraction circuit configured to generate the second amplifier signal by subtracting the positive reference voltage level from a voltage level of an output signal of the second amplifier.

12. The ADC of claim 11, wherein the first amplifier is connected in parallel with the second amplifier.

13. The ADC of claim 8, wherein the plurality of converter circuits are connected to output terminals of the amplifier circuit.

14. The ADC of claim 8, wherein a first resistor is connected to an input terminal of a first amplifier included in the amplifier circuit, and a second resistor is connected to an input terminal of a second amplifier included in the amplifier circuit.

15. The ADC of claim 14, wherein the amplifier circuit further comprises:
a third amplifier and a fourth amplifier configured to receive the first amplifier signal;
a fifth amplifier and a sixth amplifier configured to receive the second amplifier signal;
a second addition circuit configured to generate a third amplifier signal from among the plurality of amplifier signals by adding the positive reference voltage level to a voltage level of an output signal of the third amplifier;
a second subtraction circuit configured to generate a fourth amplifier signal from among the plurality of amplifier signals by subtracting the positive reference voltage level from a voltage level of an output signal of the fourth amplifier;
a third addition circuit configured to generate a fifth amplifier signal from among the plurality of amplifier signals by adding the positive reference voltage level to a voltage level of an output signal of the fifth amplifier; and
a third subtraction circuit configured to generate a sixth amplifier signal from among the plurality of amplifier signals by subtracting the positive reference voltage level from a voltage level of an output signal of the sixth amplifier.

16. The ADC of claim 8, wherein the first through sixth amplifiers have a voltage gain of 2.

17. An analog-to-digital converter (ADC) for converting an analog signal into a digital signal, the ADC comprising:
an amplifier circuit configured to:
receive the analog signal and generate an amplified signal by amplifying the analog signal,
generate a first amplifier signal by adding a positive reference voltage to the amplified analog signal, and
generate a second amplifier signal by subtracting the positive reference voltage from the amplified analog signal;
a converter circuit configured to generate the digital signal,
wherein based on the first amplifier signal having a voltage level lower than or equal to the positive reference voltage and higher than or equal to a negative reference voltage corresponding to the positive reference voltage, the converter circuit is configured to generate the digital signal from the first amplifier signal, and
wherein based on the second amplifier signal having the voltage level lower than or equal to the positive reference voltage and higher than or equal to the negative reference voltage, the converter circuit is configured to generate the digital signal from the second amplifier signal.

18. The ADC of claim 17, further comprising a comparison circuit configured to:
   generate a first conversion target signal by comparing the first conversion target signal with the positive reference voltage,
   generate a second conversion target signal by comparing the second conversion target signal with the negative reference voltage,
   based on the first amplifier signal having the voltage level lower than or equal to the positive reference voltage and higher than or equal to the negative reference voltage, select the first conversion target signal as a selected conversion target signal,
   based on the second amplifier signal having the voltage level lower than or equal to the positive reference voltage and higher than or equal to the negative reference voltage, select the second conversion target signal as the selected conversion target signal, and provide the selected conversion target signal to the converter circuit.

19. The ADC of claim 17, wherein the converter circuit comprises:
   a first converter circuit configured to convert the first amplifier signal to a first digital signal,
   a second converter circuit configured to convert the second amplifier signal to a second digital signal, and
   a selection circuit configured to:
      based on the first amplifier signal having the voltage level lower than or equal to the positive reference voltage and higher than or equal to the negative reference voltage, select the first digital signal as the digital signal, and
      based on the second amplifier signal having the voltage level lower than or equal to the positive reference voltage and higher than or equal to the negative reference voltage, select the second digital signal as the digital signal.

\* \* \* \* \*